(12) United States Patent
Matsudate et al.

(10) Patent No.: US 8,404,125 B2
(45) Date of Patent: Mar. 26, 2013

(54) METAL PROCESSING METHOD, MANFACTURING METHOD OF METAL MASK AND MANUFACTURING METHOD OF ORGANIC LIGHT EMITTING DISPLAY DEVICE

(75) Inventors: Noriharu Matsudate, Kujukuri (JP); Takeshi Ookawara, Mobara (JP)

(73) Assignees: Hitachi Displays, Ltd., Chiba (JP); Canon Kabushiki Kaisha, Tokyo (JP)

( * ) Notice: Subject to any disclaimer, the term of this patent is extended or adjusted under 35 U.S.C. 154(b) by 317 days.

(21) Appl. No.: 12/843,952

(22) Filed: Jul. 27, 2010

(65) Prior Publication Data

US 2011/0027461 A1 Feb. 3, 2011

(30) Foreign Application Priority Data

Jul. 29, 2009 (JP) ................................. 2009-176794

(51) Int. Cl.
- *B44C 1/22* (2006.01)
- *C23F 1/00* (2006.01)
- *B05D 5/06* (2006.01)
- *B05D 1/32* (2006.01)
- *B05C 11/11* (2006.01)

(52) U.S. Cl. ................ 216/12; 216/41; 216/46; 216/95; 216/100; 427/70; 427/255.6; 427/271; 427/282; 118/504

(58) Field of Classification Search .................... 216/12, 216/41, 56, 95, 100; 427/70, 255.6, 282; 118/504–505
See application file for complete search history.

(56) References Cited

U.S. PATENT DOCUMENTS

| | | | | |
|---|---|---|---|---|
| 3,855,023 A | * | 12/1974 | Spicer et al. | 430/296 |
| 5,698,299 A | * | 12/1997 | Schmidt et al. | 428/209 |
| 6,391,216 B1 | * | 5/2002 | Nakatani | 216/41 |
| 2007/0273515 A1 | * | 11/2007 | MacKenzie et al. | 340/572.1 |

FOREIGN PATENT DOCUMENTS

JP 2003-068456 3/2003

* cited by examiner

*Primary Examiner* — James Lin
(74) *Attorney, Agent, or Firm* — Antonelli, Terry, Stout & Kraus, LLP.

(57) ABSTRACT

In a metal processing method, a photoresist liquid is applied to both surfaces of a metal plate (210) to form photoresist films (220, 230), respectively (Step S102). Subsequently, the photoresist films (220, 230) are exposed and developed so that the photoresist films (220, 230) is removed while leaving the photoresist films (220, 230) corresponding to portions in which a hole is to be formed (Step S103). Next, metal thin films (240, 250) are formed on both the surfaces of the metal plate (210), respectively, on which the photoresist films (220, 230) are formed (Step S104). Subsequently, the photoresist films (220, 230) are removed, and metal thin films (245, 255) are also removed, which are formed on the photoresist films (220, 230), respectively (Step S105). Finally, the metal plate (210) is immersed in an etchant to be etched, to thereby form a high-precision hole in the metal plate (210) (Step S106).

9 Claims, 6 Drawing Sheets

METAL PROCESSING METHOD, MANFACTURING METHOD OF METAL MASK AND MANUFACTURING METHOD OF ORGANIC LIGHT EMITTING DISPLAY DEVICE

CROSS-REFERENCE TO RELATED APPLICATION

The present application claims priority from Japanese application JP 2009-176794 filed on Jul. 29, 2009, the content of which is hereby incorporated by reference into this application.

BACKGROUND OF THE INVENTION

1. Field of the Invention

The present invention relates to a metal processing method, and a manufacturing method for a metal mask and a manufacturing method for an organic light emitting panel using the metal processing method. More specifically, the present invention relates to a metal processing method of processing a metal surface, a manufacturing method for a metal mask using the metal processing method, and a manufacturing method for an organic light emitting display device using the metal processing method.

2. Description of the Related Art

In recent years, an image display device using self light emitting elements called organic light emitting diodes (OLED) (hereinafter, referred to as "organic light emitting display device") has entered the practical stage. Compared to conventional liquid crystal display devices, the organic light emitting display device, using the self light emitting elements, has superior visibility and response speed, and further thinning and power saving may be achieved because an auxiliary lighting device, such as a backlight, is unnecessary.

In the organic light emitting display device, low-molecular organic light emitting layers, which are self light emitting elements, are RGB light emitting layers to constitute a pixel array. In general, those organic light emitting layers are deposited on a glass substrate by vacuum vapor deposition as described in Japanese Patent Application Laid-open No. 2003-68456. The deposited organic light emitting layers have a direct influence on display screen definition. Therefore, forming the organic light emitting layers with stable high precision is one of the important issues in manufacturing an organic light emitting display device in terms of achieving higher resolution of the organic light emitting display device and in terms of improving yields in a manufacturing process for the organic light emitting display device.

High-precision vacuum vapor deposition is achieved under the condition that a metal mask to be used in vacuum vapor deposition is shaped with high precision. Hereinafter, a conventional manufacturing method for a metal mask is described.

FIG. 5 schematically illustrates the conventional manufacturing method for a metal mask 950 in cross-sectional view. As illustrated in FIG. 5, a metal plate 910 serving as a base of the metal mask 950 is first manufactured (Step S801). The metal plate 910 is, for example, a nickel-iron (Ni—Fe) alloy having a thickness of 50 μm. Next, a photoresist liquid is applied to upper and lower surfaces of the metal plate 910 to form photoresist films 920 and 930, respectively (Step S802). Subsequently, pattern exposure and development are performed to remove unnecessary parts of the photoresist films 920 and 930 (Step S803).

Next, the resultant metal plate 910 is immersed in an etchant so that metal portions without the photoresist films 920 and 930 are etched (Step S804) to form holes (Step S805). Finally, the remaining photoresist films 920 and 930 are removed to complete the metal mask 950 (Step S806).

SUMMARY OF THE INVENTION

However, in the above-mentioned manufacturing method for the metal mask 950, the photoresist films 920 and 930 need be a photoresist film which is resistant to the etching process of etching the metal plate 910. Accordingly, the photoresist films 920 and 930 are each required to have a film thickness of as large as 3 to 5 μm. It is therefore difficult to apply the photoresist films 920 and 930 uniformly, with the result that the photoresist films 920 and 930 are formed by pattern exposure and development with low patterning precision. This consequently causes deterioration in processing precision for the metal mask 950.

Further, the surfaces of the metal plate 910 have minute unevenness (average roughness of 1.5 μm), and hence there are a large number of portions in which the photoresist films 920 and 930 are bonded to the surfaces with insufficient adhesion. In the etching process, an etchant may creep into those portions having insufficient adhesion, leading to overetching, which etches even a portion that properly needs to remain unetched. FIG. 6 illustrates how overetching 940 occurs. FIG. 6 is a partially enlarged view corresponding to Step S805 of FIG. 5. As illustrated in FIG. 6, the overetching 940 is likely to occur in the portions with insufficient adhesion in the vicinity of holes. Accordingly, the overetching 940 is also responsible for the deterioration in processing precision for the metal mask 950.

The present invention has been made in view of the above-mentioned circumstances, and therefore it is an object of the present invention to provide a high-precision metal processing method, a manufacturing method for a metal mask using the metal processing method, and a manufacturing method for an organic light emitting display device using the metal processing method.

A metal processing method of processing a metal surface according to the present invention includes: a photolithography step of forming a photoresist film on a processing portion of the metal surface; a metal thin film forming step of forming a metal thin film on the photoresist film and on the metal surface where the photoresist film is not formed; a photoresist film removing step of removing the photoresist film together with the metal thin film formed on the photoresist film; and an etching step of etching the processing portion of the metal surface, the processing portion is exposed in the photoresist film removing step.

The photolithography step described above means a photolithography step including respective steps of coating, exposure, and development of a photosensitive organic solvent called photoresist material, which is used in a semiconductor manufacturing and the like. The resist material for use may be a Novolak-type or chemically-amplified resist material, or resist materials of other types. Further, the etching step described above is also an etching step used in the semiconductor manufacturing and the like, and may employ any one of dry etching and wet etching. Still further, the forming the metal thin film encompasses a case where the metal thin film is formed so that an alloy is consequently formed on a metal surface.

Further, in the metal processing method according to the present invention, the metal surface may be a surface of a plate-like metal, and the plate-like metal may be processed from its both sides.

Further, in the metal processing method according to the present invention, the etching step may include a step of forming a through hole in the metal having the metal surface.

Further, in the metal processing method according to the present invention, the photoresist film removing step may include swelling the photoresist film.

Further, in the metal processing method according to the present invention, the metal having the metal surface may be an alloy containing iron as a main component.

Further, in the metal processing method according to the present invention, the metal thin film may contain either one of titanium and nickel.

Further, in the metal processing method according to the present invention, the metal thin film may be formed by either one of vacuum vapor deposition and sputtering.

Further, the metal processing method according to the present invention may further include a metal thin film removing step of removing the metal thin film after the etching step.

A manufacturing method for a metal mask according to the present invention includes: a step of preparing a metal plate serving as a base of the metal mask; and a step of processing the metal plate using the above-mentioned metal processing method according to any one of aspects described above.

A manufacturing method for an organic light emitting display device according to the present invention includes: a step of preparing a metal plate serving as a base of a metal mask; a step of processing the metal plate using the above-mentioned metal processing method according to any one of the aspects described above, to thereby manufacture the metal mask; and an organic light emitting layer vapor-depositing step of vapor-depositing an organic light emitting layer as a light emitting element on a glass substrate by using the metal mask.

DETAILED DESCRIPTION OF THE INVENTION

Figure 1:
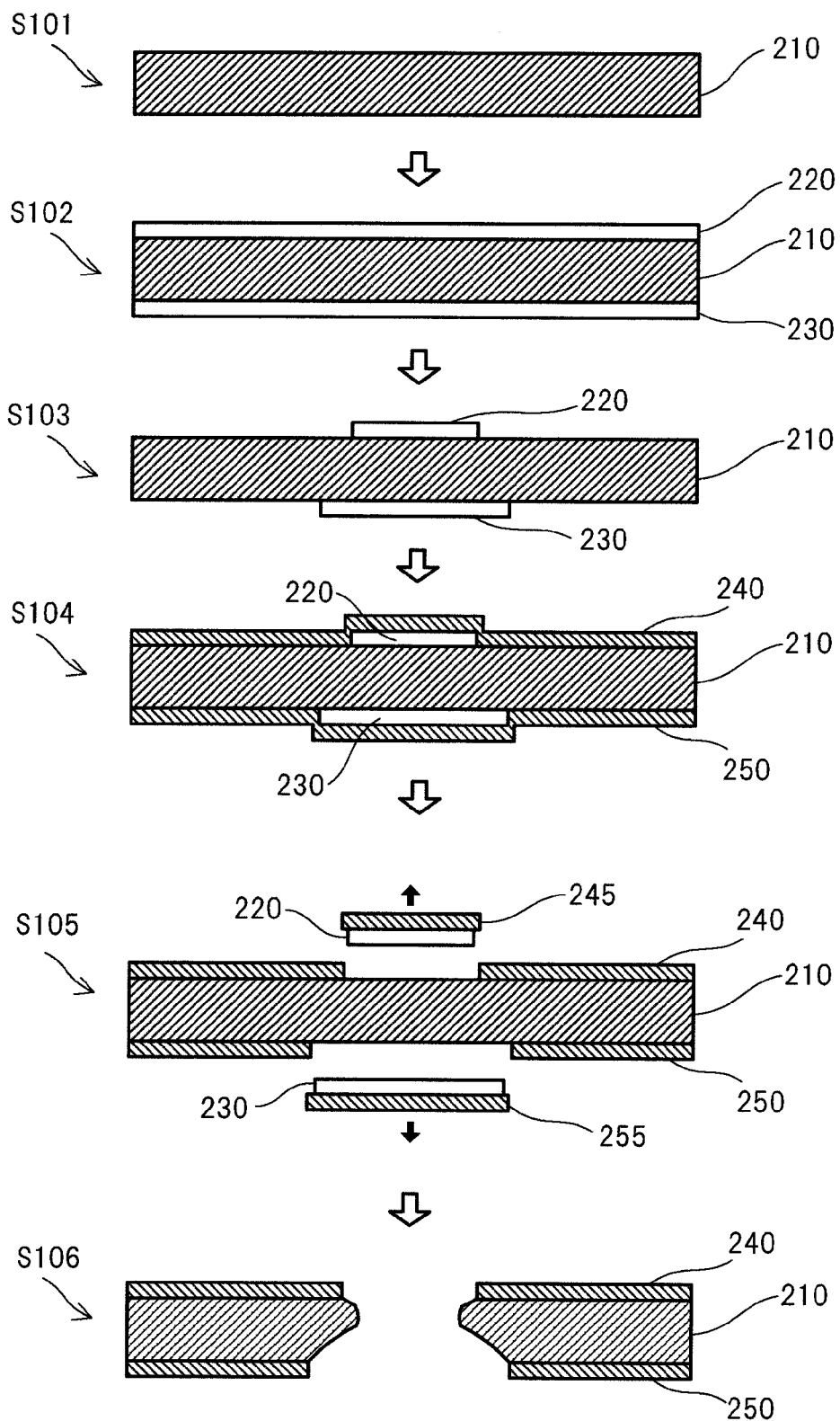
FIG. 1 illustrates a metal processing method according to a first embodiment of the present invention.

Hereinafter, first to third embodiments of the present invention are described with reference to the accompanying drawings. It should be noted that the same or equivalent components are denoted by the same reference numerals throughout the drawings, and repetitive description thereof is omitted.

[First Embodiment]

FIG. 1 illustrates a metal processing method according to the first embodiment of the present invention in cross-sectional view. According to the metal processing method, a metal plate 210 to be processed is first prepared in Step S101. The metal plate 210 for use in this embodiment is formed of a material of a 36% Ni—Fe alloy with a thickness of 50 μm. Next, in Step S102, a photoresist liquid is applied to both surfaces of the metal plate 210 to form photoresist films 220 and 230, respectively.

Unlike the above-mentioned conventional example, the photoresist films 220 and 230 are not to be exposed to so strong acid etchant that etches the metal plate (steel base). Accordingly, the photoresist films 220 and 230 need not be formed so thick, and there is no limitation for a material and a manufacturing method therefor. Subsequently, in Step S103, the photoresist films 220 and 230 are exposed and developed so that the photoresist films 220 and 230 are removed while leaving the photoresist films 220 and 230 corresponding to process-subject portions, that is, portions in which a hole is to be formed in this embodiment.

Next, in Step S104, metal thin films 240 and 250 are formed on both the surfaces of the metal plate 210, respectively, on which the photoresist films 220 and 230 are formed. In this embodiment, the metal thin films 240 and 250 are each a titanium (Ti) thin film formed by vacuum vapor deposition at a film thickness of 300 nm. Subsequently, in Step S105, the photoresist films 220 and 230 are removed because of swelling, and also metal thin films 245 and 255 are removed, which are formed on the photoresist films 220 and 230, respectively.

In this way, the resultant metal plate 210 is masked with the metal thin films 240 and 250, and in Step S106, the metal plate 210 is immersed in an etchant to be etched, to thereby form a high-precision hole in the metal plate 210. Here, Ferric Chloride may be used as the etchant.

Unlike the conventional example, the photoresist films 220 and 230 of this embodiment need not be provided with acid resistance. Therefore, the photoresist films 220 and 230 may be thinned, to thereby improve precision for the photoresist films 220 and 230. In addition, improved patterning precision is obtained for the metal thin films 240 and 250, which are vapor-deposited using the photoresist films 220 and 230 as masks. As a result, the metal plate 210 may be processed with high precision.

Further, the metal thin films 240 and 250 are each bonded with the metal plate 210 enough to prevent the etchant from getting thereinto, to thereby suppress overetching. As a result, the metal plate 210 may be processed with high precision.

[Second Embodiment]

Figure 2A:
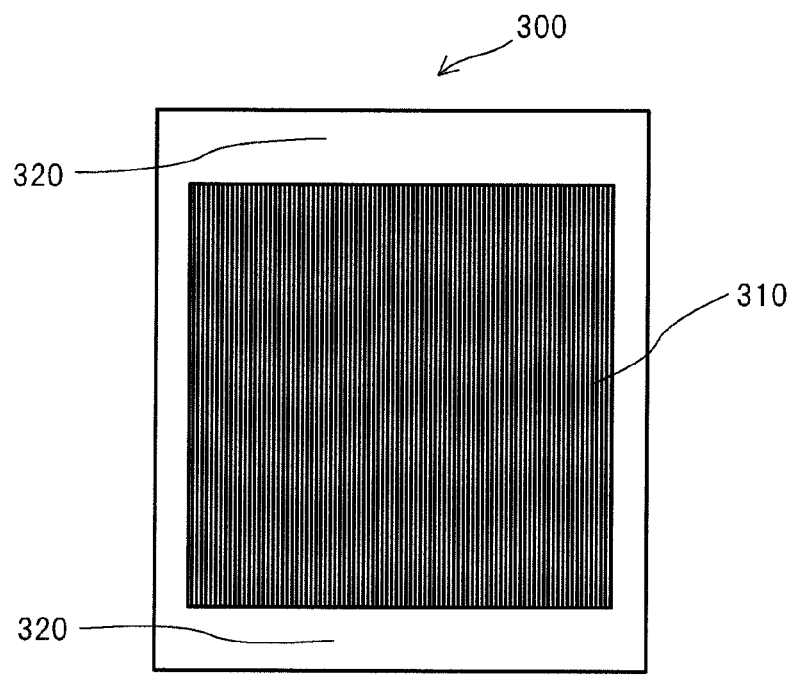
FIG. 2A illustrates a metal mask which is manufactured by a manufacturing method for a metal mask according to the present invention.
Figure 2B:
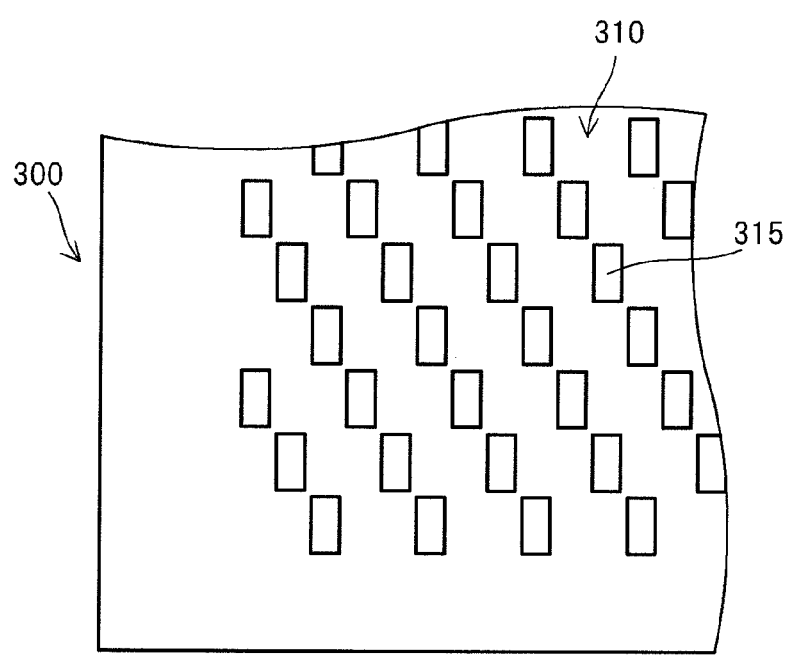
FIG. 2B is a partially enlarged view of the metal mask of FIG. 2A.

A manufacturing method for a metal mask according to the second embodiment of the present invention is described with reference to FIGS. 2A and 2B. FIG. 2A illustrates a metal mask 300 which is manufactured by the manufacturing method for a metal mask according to the present invention. The metal mask 300 is used in vapor deposition of an organic light emitting layer serving as a pixel electrode of an organic light emitting display device. In this embodiment, respective organic light emitting layers of three RGB colors are vapor-deposited separately, and hence three types of the metal mask 300 are necessary. It should be noted that FIGS. 2A and 2B illustrate one of the three types thereof.

As illustrated in FIG. 2A, the metal mask 300 includes a mask effective portion 310 having holes formed therein for use in vapor deposition, and a support portion 320 for fixing the metal mask 300 to a fixture. FIG. 2B is a partially enlarged view of the metal mask 300 of FIG. 2A. As illustrated in FIG. 2B, the mask effective portion 310 has holes 315 arranged therein for use in vapor deposition of the organic light emitting layers.

Similarly to the first embodiment, a metal plate serving as a base of the metal mask 300 is formed of a material of a 36% Ni—Fe alloy with a thickness of 50 µm. Using the metal processing method of the first embodiment illustrated in FIG. 1, the metal mask 300 is manufactured by forming the holes 315 in the metal plate. Table 1 shows measurement results in Example of this embodiment.

TABLE 1

|  | Conventional Example | Example |
|---|---|---|
| Material | 36% Ni—Fe | 36% Ni—Fe |
| Plate thickness | 50 µm | 50 µm |
| Opening diameter design value | 40 µm | 40 µm |
| Pitch design value | 120 µm | 120 µm |
| Opening diameter (average) | 45 µm | 41 µm |
| Opening diameter precision | ±5 µm | ±1 µm |

Figure 5:
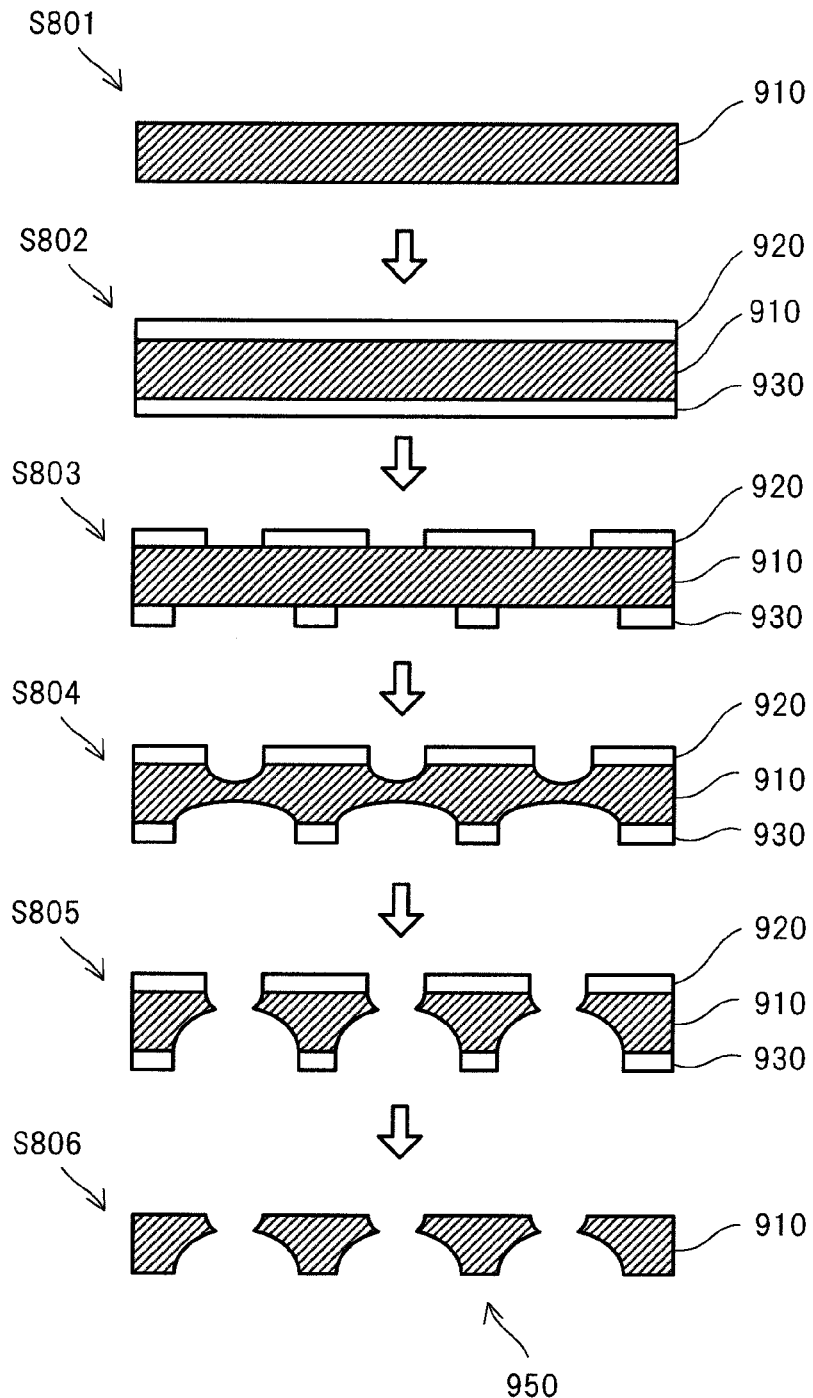
FIG. 5 schematically illustrates a conventional manufacturing method for a metal mask.
Figure 6:
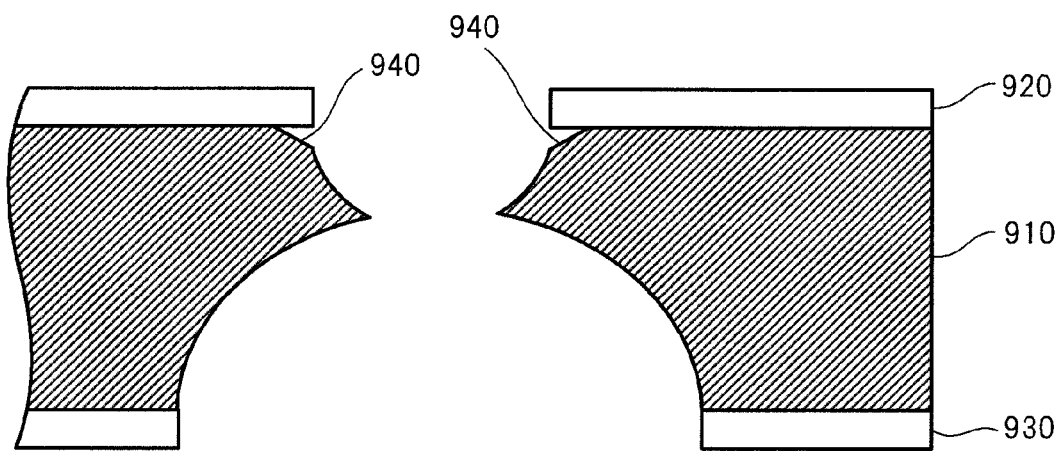
FIG. 6 illustrates the overetching of the metal mask.

It should be noted that Conventional Example in Table 1 corresponds to an example of the metal mask manufactured by the conventional processing illustrated in FIG. 5. As shown in Table 1, compared to 45 µm in Conventional Example, the average opening diameter according to the manufacturing method for a metal mask of the present invention is 41 µm, which is more approximate to 40 µm as a design value. Further, the fluctuation in opening diameters is reduced to 1 µm from 5 µm in Conventional Example. Accordingly, it is understood that more stable high-processing precision is achieved.

Therefore, similarly to the first embodiment, in the manufacturing of the metal mask 300 according to the second embodiment, photoresist films may be thinned, to thereby improve precision for the photoresist films. Accordingly, improved patterning precision is obtained for metal thin films, which are vapor-deposited using the photoresist films as masks. As a result, the metal mask 300 may be processed with high precision.

Further, the metal thin films are each bonded with adhesion the metal plate to prevent an etchant from getting thereinto, to thereby suppress overetching. As a result, the metal mask 300 may be processed with high precision.

Still further, the opening diameter precision is improved to also improve the pitch precision of the metal mask 300. Besides, owing to those improvements in processing precision, even when a tension is applied to the metal mask, this stress is distributed uniformly over the metal mask. Therefore, the strength of the mask is enhanced while achieving longer life thereof.

[Third Embodiment]

A manufacturing method for an organic light emitting display device according to the third embodiment of the present invention is described with reference to FIG. 3 and FIG. 4.

Figure 3:
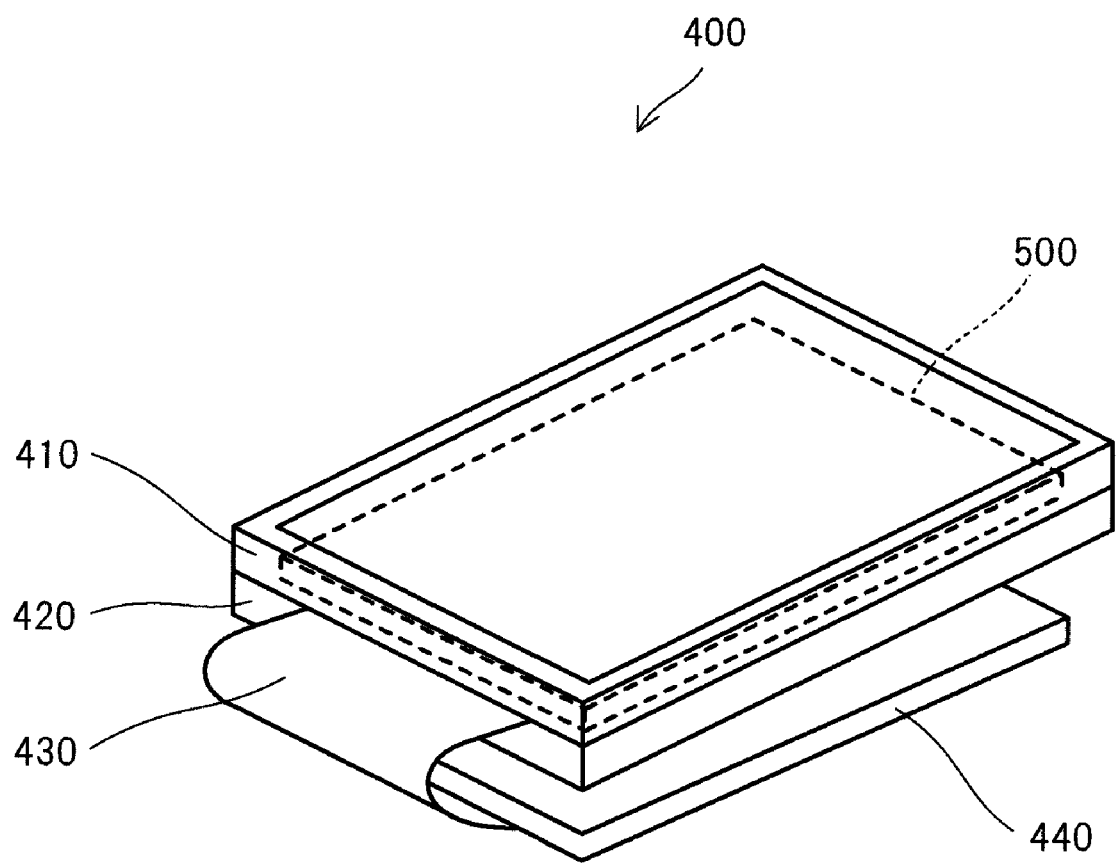
FIG. 3 illustrates an organic light emitting display device which is manufactured by a manufacturing method for an organic light emitting display device according to the present invention.

FIG. 3 illustrates an organic light emitting display device 400 which is manufactured by the manufacturing method for an organic light emitting display device according to the present invention. As illustrated in FIG. 3, the organic light emitting display device 400 includes an organic light emitting panel 500, an upper frame 410 and a lower frame 420 which sandwich and fix the organic light emitting panel 500 therebetween, a circuit board 440 provided with circuit elements for generating display information, and a flexible board 430 for transmitting the information generated in the circuit board 440 to the organic light emitting panel 500.

Figure 4:
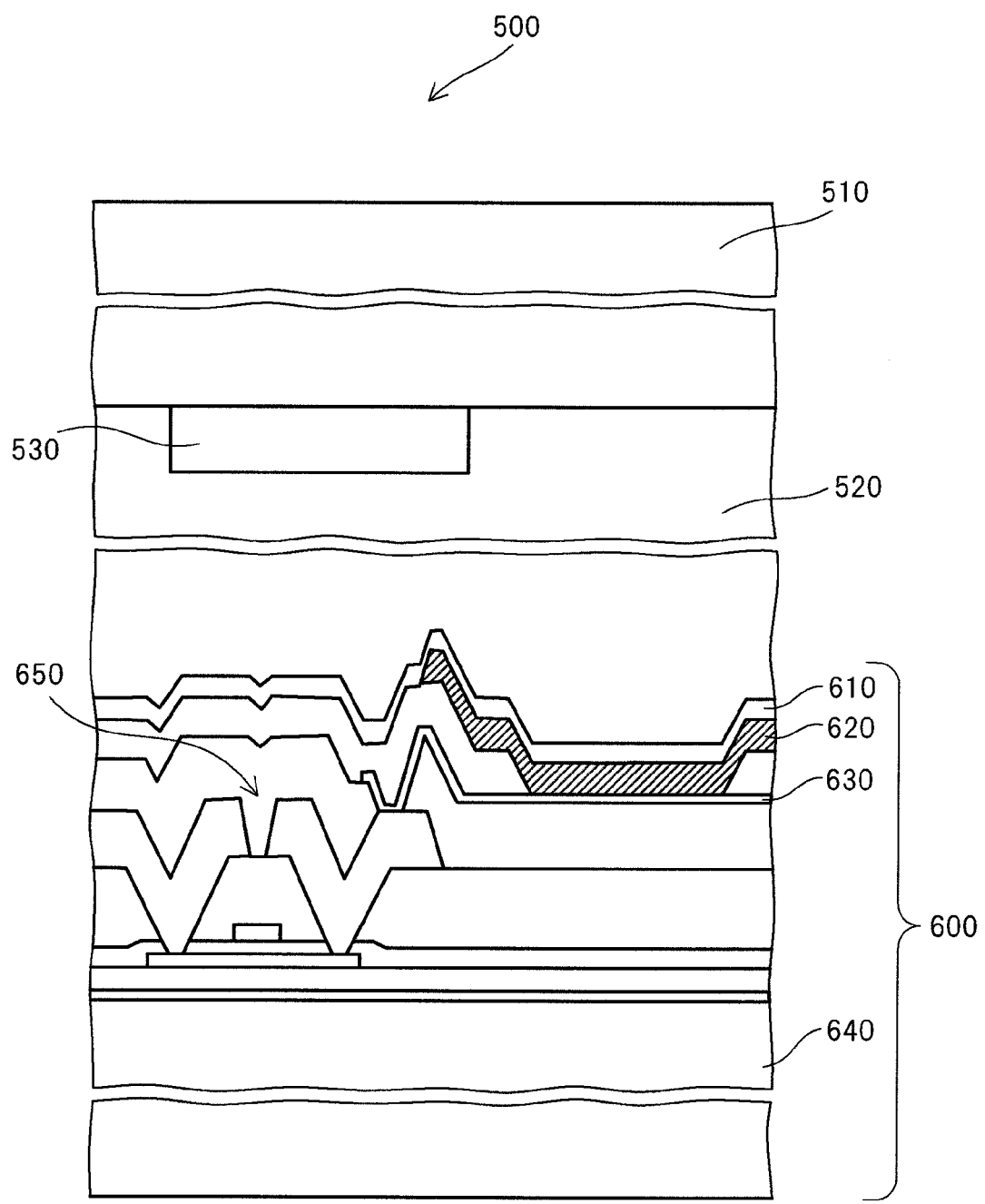
FIG. 4 illustrates an organic light emitting panel of the organic light emitting display device of FIG. 3 in a partial cross-section.

FIG. 4 illustrates the organic light emitting panel 500 in a partial cross-section. As illustrated in FIG. 4, the organic light emitting panel 500 includes a seal substrate 510 for shielding an organic light emitting layer 620, which is described later, from air, a seal gas layer 520 in which nitrogen ($N_2$) is filled, a desiccant 530 inside the seal gas layer 520, and a thin film transistor (TFT) substrate 600.

The TFT substrate 600 includes a cathode 610 made of aluminum (Al), the organic light emitting layer 620 which is vapor-deposited using the metal mask 300 according to the second embodiment, a transparent anode 630 made of indium tin oxide (ITO), a glass substrate 640 as a base, and a TFT 650 serving as a switch for allowing the organic light emitting layer 620 to emit light. As illustrated in FIG. 4, the organic light emitting panel 500 has a bottom emission structure in which light is emitted from the organic light emitting layer 620 side to the glass substrate 640 side.

Using the metal mask 300 manufactured in the second embodiment, the organic light emitting display device 400 is manufactured in the following manner. First, the organic light emitting layer 620 is formed by vacuum vapor deposition. Subsequently, the TFT substrate 600, in which the organic light emitting layer 620 is formed, is used to assemble the organic light emitting panel 500 as illustrated in FIG. 4. Then, the organic light emitting panel 500 is incorporated into the organic light emitting display device 400 as illustrated in FIG. 3.

According to the third embodiment, the organic light emitting display device 400 is manufactured using the high-precision metal mask 300. Therefore, high resolution of the organic light emitting display device 400 may be achieved, as well as high manufacturing quality and improved yields.

It should be noted that a Ti film is used as the metal thin film in the first embodiment, but other metal films, such as a nickel (Ni) film, may be used.

Further, in the first embodiment, the method of forming the metal thin film employs vacuum vapor deposition, but other vapor deposition including physical vapor deposition, such as sputtering, may be employed.

Still further, in the first embodiment, the film thickness of the metal film is set to 300 nm, but any value is available for the film thickness, preferably 300 nm to 3 µm. In the first embodiment, the photoresist film and the metal film formed thereon are removed because of swelling, but those films may be removed using other methods, such as dissolution.

Further, in the second embodiment, the metal mask is aimed at vapor deposition of organic light emitting layers of three colors, but the metal mask may be aimed at a single-color organic light emitting display device or a passive matrix organic light emitting display device.

Still further, in the second embodiment, the metal mask is aimed at vapor deposition of organic light emitting layers of an organic light emitting display device, but the metal mask may be aimed at vapor deposition for other purposes. The metal mask may also be aimed at other applications, such as etching, electroforming, and laser cutting.

Further, although not particularly specified in the third embodiment, the light emitting material for use in the organic light emitting layer may be any one of high-molecular and low-molecular light emitting materials. Still further, the bottom emission is employed in the third embodiment, but top emission may be employed.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A metal processing method of processing a metal surface, comprising:
    a photolithography step of forming a photoresist film on a processing portion of the metal surface;
    a metal thin film forming step of forming a metal thin film on the metal surface and the photoresist film after the photolithography step;
    a photoresist film removing step of removing the photoresist film together with the metal thin film formed on the photoresist film; and
    an etching step of etching the processing portion of the metal surface, the processing portion is exposed in the photoresist film removing step; and
    wherein the etching step comprises a step of forming a through hole in a metal having the metal surface.

2. The metal processing method according to claim 1, wherein the metal surface is at least one surface of a plate-like metal, and
    wherein each of the photolighography step, the metal thin film forming step, the photoresist film removing step and the etching step is applied to both surfaces of the plate-like metal.

3. The metal processing method according to claim 1, wherein the photoresist film removing step comprises swelling the photoresist film.

4. The metal processing method according to claim 1, wherein a metal having the metal surface is an alloy containing iron as a main component.

5. The metal processing method according to claim 1, wherein the metal thin film contains either one of titanium and nickel.

6. The metal processing method according to claim 1, wherein the metal thin film is formed by either one of vacuum vapor deposition and sputtering.

7. The metal processing method according to claim 1, further comprising a metal thin film removing step of removing the metal thin film after the etching step.

8. A manufacturing method of a metal mask, comprising:
    a step of preparing a metal plate serving as a base of the metal mask; and
    a step of processing the metal plate using the metal processing method according to any one of claims 1, 2 and 3 to 7.

9. A manufacturing method of an organic light emitting display device, comprising:
    a step of preparing a metal plate serving as a base of a metal mask;
    a step of processing the metal plate using the metal processing method according to any one of claims 1, 2 and 3 to 7, to thereby manufacture the metal mask; and
    an organic light emitting layer vapor-depositing step of vapor-depositing an organic light emitting layer as a light emitting element on a glass substrate by using the metal mask.

* * * * *